United States Patent
Behera et al.

(10) Patent No.: US 7,031,866 B1
(45) Date of Patent: Apr. 18, 2006

(54) SYSTEM AND METHOD FOR TESTING A MEMORY

(75) Inventors: Niranjan Behera, Fremont, CA (US); Bruce L. Prickett, Jr., Fremont, CA (US)

(73) Assignee: Virage Logic Corp., Fremont, CA (US)

( * ) Notice: Subject to any disclaimer, the term of this patent is extended or adjusted under 35 U.S.C. 154(b) by 27 days.

(21) Appl. No.: 10/701,545

(22) Filed: Nov. 5, 2003

(51) Int. Cl.
*G01R 31/00* (2006.01)
*G01R 31/14* (2006.01)

(52) U.S. Cl. .................................................. 702/117

(58) Field of Classification Search ............ 702/57–59, 702/117–121, 182–185; 365/189.04, 200, 365/201; 714/718–720, 733
See application file for complete search history.

(56) References Cited

U.S. PATENT DOCUMENTS

| 6,396,760 | B1 | 5/2002 | Behera et al. | |
| 6,519,202 | B1 | 2/2003 | Shubat et al. | |
| 6,587,979 | B1 * | 7/2003 | Kraus et al. | 714/720 |
| 6,691,264 | B1 * | 2/2004 | Huang | 714/723 |
| 2005/0028050 | A1 * | 2/2005 | Ganry | 714/700 |

* cited by examiner

*Primary Examiner*—Michael Nghiem
(74) *Attorney, Agent, or Firm*—Danamraj & Youst, P.C.

(57) ABSTRACT

A method and apparatus for testing a memory at speed. A test and repair wrapper integrated with a memory instance is operable to receive test information scanned in from a built-in self-test and repair (BISTR) processor. Logic circuitry associated with the test and repair wrapper is operable to generate address, data and command signals based on the scanned test information, wherein the signals are used for effectuating one or more tests with respect to the memory instance.

23 Claims, 6 Drawing Sheets

SYSTEM AND METHOD FOR TESTING A MEMORY

CROSS-REFERENCE TO RELATED APPLICATION(S)

This application discloses subject matter related to the subject matter disclosed in the following commonly owned co-pending patent application(s): "System And Method For Repairing A Memory," filed Nov. 5, 2003, application Ser. No.: 10/702,014, in the name(s) of Niranjan Behera, Bruce L. Prickett, Jr. and Yervant Zorian, which is(are) hereby incorporated by reference for all purposes.

BACKGROUND OF THE INVENTION

1. Technical Field of the Invention

The present invention relates generally to semiconductor memories. More particularly, and not by way of any limitation, the present invention is directed to a system and method for testing a memory instance at speed.

2. Description of Related Art

Typically, memories are tested and repaired by serially transmitting commands from a built-in self-test and repair (BISTR) interface that is clocked with a test clock and then allowing the memory to perform a read or write operation. A processor, called a BISTR processor, is usually provided for effectuating the testing operations. When several memory instances are interfaced with a single BISTR processor, the serial command transfer process is slow and significantly limited by the delays inherent in the long signal paths necessitated by design and layout constraints. Accordingly, the memory testing operations are executed at a slower frequency than the clock frequency associated with the memory. Additionally, the BISTR processor has to take a finite number of test clock cycles for each operation in order to send all commands serially, thereby substantially impacting the testing performance.

SUMMARY OF THE INVENTION

The present invention provides a method and apparatus for testing memory (e.g., one or more memory instances such as compilable instances) at speed. A test and repair wrapper integrated with a memory instance is operable to receive test information scanned in from a built-in self-test and repair (BISTR) processor. Logic circuitry associated with the test and repair wrapper is operable to generate address, data and command signals based on the scanned test information, wherein the signals are used for effectuating one or more tests with respect to the memory instance. In one exemplary embodiment, the tests may include, for instance, single cycle write operations; single cycle read operations; same cycle, simultaneous read/write operations; back-to-back write operations; back-to-back write followed by read operations; back-to-back read operations; back-to-back read followed by write operations, and the like.

In one aspect, the present invention is directed to a method of testing a memory instance which comprises the following operations: scanning test information into a test and repair wrapper integrated with the memory instance; providing a control signal to the test and repair wrapper for signaling commencement of testing operations with respect to the memory instance; generating at least one of an address signal, a data signal and a command signal, by address generator logic, data generator logic and command generator logic, respectively, of the test and repair wrapper, wherein the signals are based on the scanned test information; and executing one or more tests with respect to the memory instance responsive to the address/data/command signals generated by the test and repair wrapper.

In another aspect, the present invention is directed to an apparatus for testing a memory instance. A BISTR processor is provided for scanning test information into a Command Scan register block associated with a test and repair wrapper that is integrated with the memory instance. Address generator logic, data generator logic and command generator logic provided as part of the test and repair wrapper circuitry are operable to generate test address signals, test data signals and applicable test commands for carrying out testing operations with respect to the memory instance. Preferably, the testing operations are executed using a memory read/write clock, thereby significantly enhancing the testing performance.

In a still further aspect, the present invention is directed to a memory compiler for compiling at least one self-test and repair (STAR) memory instance, e.g., a register file (RF) memory instance. A compiler code portion is operable for generating a BISTR processor associated with the memory instance. Another compiler code portion is operable for generating a test and repair wrapper that is integrated with the memory instance. The BISTR processor is capable of scanning testing information into the test and repair wrapper, whereupon the address/data/command logic blocks of the wrapper circuitry generate appropriate address, data and command signals for executing testing operations with respect to the memory instance.

BRIEF DESCRIPTION OF THE DRAWINGS

A more complete understanding of the present invention may be had by reference to the following Detailed Description when taken in conjunction with the accompanying drawings wherein.

DETAILED DESCRIPTION OF THE DRAWINGS

Figure 1:
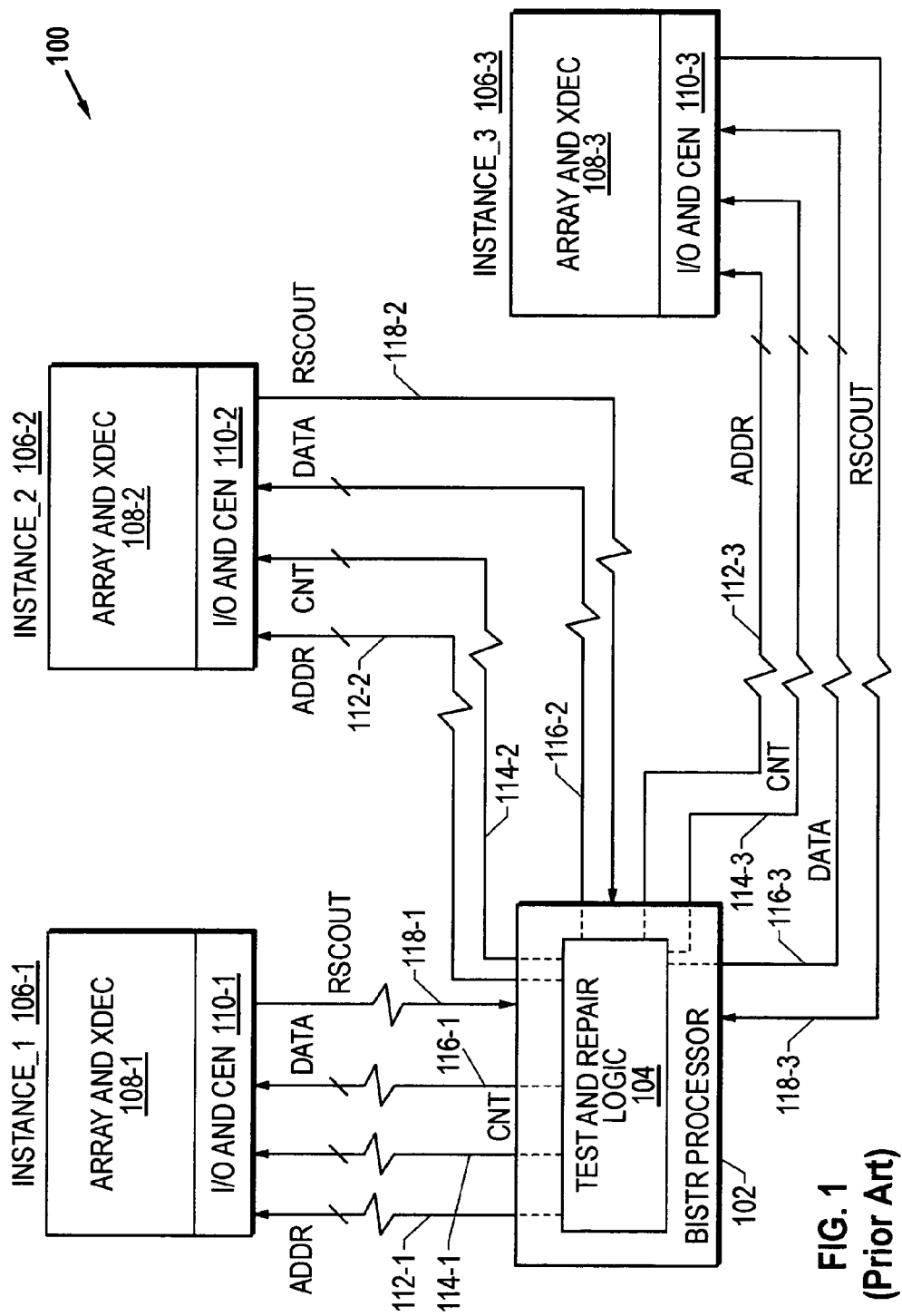
FIG. 1 (Prior Art) depicts an exemplary embodiment of a multi-instance memory device wherein a conventional testing scheme is employed.

In the drawings, like or similar elements are designated with identical reference numerals throughout the several views thereof, and the various elements depicted are not necessarily drawn to scale. Referring now to FIG. 1, depicted therein is an exemplary embodiment of a multi-instance memory device 100 wherein a conventional testing scheme is employed. A plurality of memory instances, e.g., Instance-1 106-1, Instance-2 106-2 and Instance-3 106-3, are tested using a built-in self-test and repair (BISTR) processor 102 that is operable to generate all address, data and control signals necessary for testing the memory instances, the signals being provided via a parallel interface to each instance.

By way implementation, the memory instances 106-1 through 106-3 may be comprised of any type of memory technology, architecture, and design. Each memory instance includes an array and row decoder (commonly referred to as X-Decoder or XDEC) portion that is coupled with an input/output (I/O) and associated control (referred to as CENTER, or CEN for short) block in conventional manner. Additionally, the arrays of the memory instances may be provided with variable aspect ratios and sizes. As illustrated, for example, Instance-1 106-1 includes array and XDEC portion 108-1 that is coupled with I/O and CEN block 110-1. Likewise, reference numerals 108-2, 110-2 and 108-3, 110-3 refer to the array/XDEC portion and I/O plus CEN blocks of the other two instances, respectively.

As alluded to in the foregoing, each memory instance is tested with a parallel signal interface supported by the BISTR processor 102. A test and repair logic block 104 is included as part of the BISTR processor 102 for generating all applicable address, data and control signals with respect to the each of the instances to be tested. Further, where redundancy is implemented, each memory instance is also operable to provide repair/redundancy information via a separate signal path to the BISTR processor 102 so that failing memory locations may be substituted with properly-functioning replacement locations. Accordingly, reference numerals 112-1, 112-2 and 112-3 refer to three address (ADDR) signal paths disposed between the BISTR processor 102 and Instances 106-1, 106-2 and 106-3, respectively, that carry address information for effectuating test operations with respect thereto. Likewise, test-related control information and data generated by the test and repair logic block 104 are carried by CNT and DATA signal paths, 114-1 through 114-3 and 116-1 through 116-3, respectively. Similarly, redundancy information from the three memory instances is provided to the BISTR processor 102 via RSCOUT signal paths 118-1, 118-2 and 118-3, respectively.

Where multiple memory instances are to be tested using the BISTR processor's parallel signal interface scheme as set forth above, it can be readily seen that the various signal paths may get loaded heavily. In addition, due to path layout constraints, the test signals need to traverse long—and variable—distances that span between the memory instances and the BISTR processor block. Also, as the memories become wider (i.e., more number of output bits), the interface becomes rather clumsy. This is because the total number of parallel interfacing signals increases significantly as the memory is designed with a wider aspect. As pointed out in the Background section of the present patent application, such aspects of the conventional memory testing schemes give rise to a number of drawbacks and shortcomings.

Figure 2:
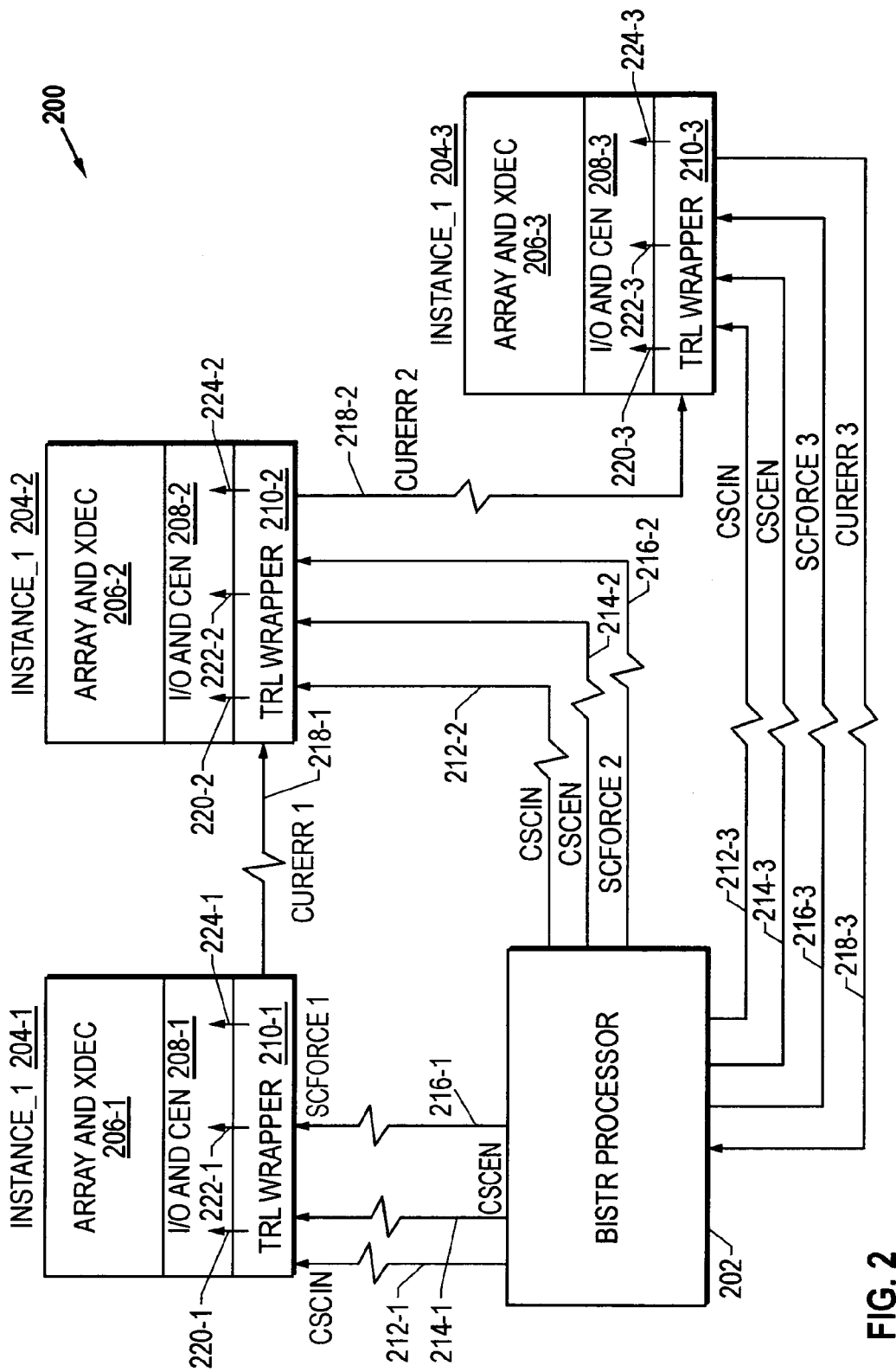
FIG. 2 depicts an exemplary embodiment of a multi-instance memory device wherein an integrated test repair logic (TRL) wrapper is advantageously employed for effectuating memory testing at speed in accordance with the teachings of the present invention.

FIG. 2 depicts an exemplary embodiment of a multi-instance memory device 200 wherein an integrated test repair logic (TRL) wrapper is advantageously employed for effectuating memory testing at speed in accordance with the teachings of the present invention. In one presently preferred implementation, the device 200 may be comprised of an SOC device that includes a plurality of memory instances, embedded therein, e.g., Instances 204-1, 204-2 and 204-3. More particularly, in a still further exemplary embodiment, the device 200 may be a self-test and repair (STAR) memory device wherein each memory instance is provided with an integrated or embedded test and repair logic (TRL) wrapper that can be compiled along with the memory instances.

Each memory instance may be comprised of any known or heretofore unknown architecture and technology, and includes a primary or main array and a redundant portion (either redundant rows, redundant columns, or both, and not explicitly shown in this FIG.) in any manner or configuration. Accordingly, the memory instances may be selected from the group including static random access memory (SRAM) instances, dynamic RAM (DRAM) instances, electrically programmable read-only memory (EPROM) instances, Flash memory instances, dual-port register file (RF) memory instances, and the like.

Each memory instance includes an array and XDEC portion that is coupled with an I/O and CEN block. In addition, the array sizes, aspect ratios, and number of I/Os can vary across the instances. As illustrated, Instance-1 204-1 includes array and XDEC portion 206-1 coupled with I/O and CEN block 208-1; Instance-2 204-2 includes array and XDEC portion 206-2 coupled with I/O and CEN block 208-2; and Instance-3 204-3 includes array and XDEC portion 206-3 coupled with I/O and CEN block 208-3.

Further, each instance is integrated with a TRL wrapper that includes logic circuitry for generating localized address, data and command signals used for testing that particular memory instance, as will be described in additional detail hereinbelow. Reference numerals 210-1, 210-2 and 210-3 refer to the three TRL wrappers integrated with Instances 204-1, 204-2 and 204-3, respectively. A BISTR processor 202 is provided for effectuating the testing of each of the memory instances via a serial interface wherein test information is first scanned into the TRL wrapper that is integrated therewith. In general, a Command Scan In (CSCIN) signal (reference numerals 212-1, 212-2 and 212-3) provided by the BISTR processor 202 is operable to carry the test information with respect to each memory instance, which may be loaded into a Command Scan register associated with the TRL wrapper upon activation by a Command Scan Enable (CSCEN) signal (reference numerals 214-1, 214-2 and 214-3). The test information may include address, data and control information relating to one or more tests, multiple memory locations, multiple commands, etc. Upon completion of scanning of the test information into the Command Scan register (not shown in this FIG.), another control signal, SCFORCE (reference numerals 216-1, 216-2 and 216-3), which is instance-specific and operates as a test strobe signal, is generated by the BISTR processor 202 for signaling commencement of testing with respect to a particular memory instance. If all memory instances have the same size and same column mux configuration, then the same SCFORCE may be employed. Responsive thereto, the TRL wrapper associated with the memory instance generates appropriate test addresses, data, and command signals based on the scanned test information that are locally used for testing that particular memory instance. Accordingly, it should be appreciated that the logic circuitry of each TRL wrapper is operable to generate localized test address, data and command signals that can be directly provided with little or no delay to the memory instance integrated therewith, whereby appreciably better timing control may be achieved with respect to the various critical signals used in memory design testing since long signal paths are advantageously avoided.

By way of illustration, reference numerals 220-1, 220-2 and 220-3 refer to the local test address signals generated by the TRL wrappers 210-1, 210-2 and 210-3, with respect to the three instances 204-1, 204-2 and 204-3, respectively.

Likewise, reference numerals 222-1, 222-2 and 222-3 refer to the three sets of locally generated data signals. The locally generated test command/control signals are referred to by reference numerals 224-1, 224-1 and 224-3, respectively. Reference numerals 218-1, 218-2 and 218-3 refer to current error (CURERR) signals generated by the TRL wrappers 210-1, 210-2 and 210-3 upon completion of testing the respective memory instances integrated therewith, which error signals may be provided via a single daisy-chained signal to the BISTR processor 202 for effectuating appropriate repair control logic.

Figure 3:
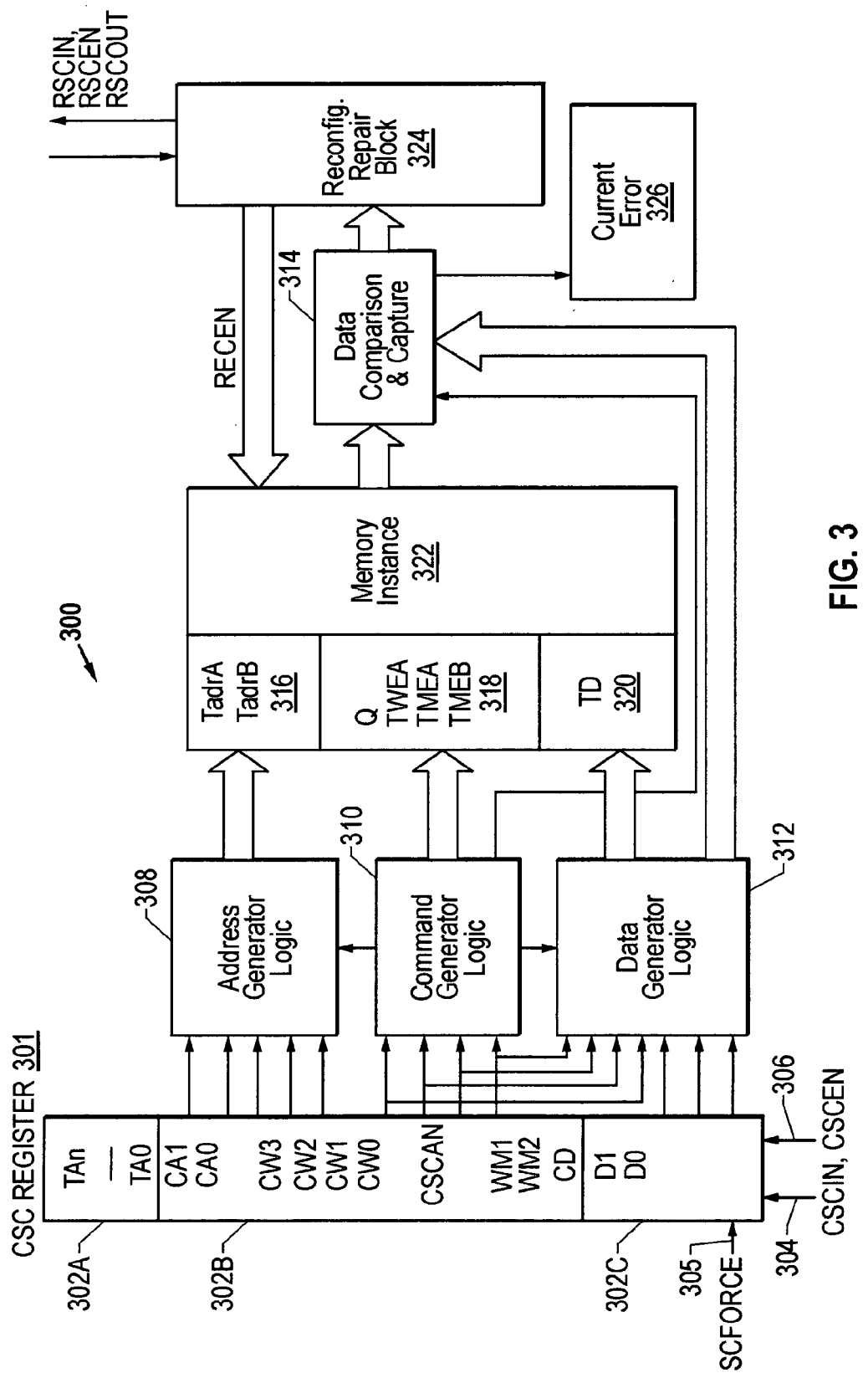
FIG. 3 depicts an exemplary embodiment of a TRL wrapper.

FIG. 3 depicts an exemplary TRL wrapper implementation 300 integrated with a memory instance 322 (e.g., a register file instance) wherein localized test address, data and command/control signals may be generated in accordance with an embodiment of the present invention. A CSC register block 301 of the TRL wrapper is operable to receive various test information signals from a BISTR processor at the rising edge of a test clock associated therewith (not shown in this FIGURE). As pointed out earlier, the scanning of the test information is controlled by two control signals generated by the BISTR processor, which are exemplified as CSCIN 304 and CSCEN 306 in FIG. 3. When CSCEN 306 is asserted (e.g., driven to a logic HIGH state), the logic levels on CSCIN 304 are appropriately toggled based on the test information to be loaded into CSC register 301. In one embodiment, the scanning process may continue as long as CSCEN 306 remains asserted.

For purposes of the present patent application, it is useful to visualize the contents of CSC register block 301 as being compartmentalized based on their type. For instance, an address portion 302A may be operable to store a plurality of test address signals (TA0, TA1, . . . , TAn) provided by the BISTR processor. Likewise, a command/control portion 302B and a data portion 302C are operable to accept various command/control signal information and data signals provided by the BISTR processor, respectively. By way of illustration, CA0 and CA1 refer to a 2-bit wide control signal that controls which bits of an address will be changed in a back-to-back memory operation as will be explained in greater detail hereinbelow. The CA[1:0] signal may also be used in a simultaneous read/write operation, where only the write address may be changed. A 4-bit wide control signal, CW[3:0], is used for determining the test commands to be locally generated. A control pin, CSCAN, is provided for determining whether to obtain the error information from a plurality of error registers or from a single current error register associated with the TRL wrapper implementation. Another control signal, CD, may be provided for determining whether to alter the write data in the second cycle of a back-to-back memory write operation (where two operations are performed within one command cycle). A 2-bit data signal, D[1:0], operable to be loaded into the data portion 302C, indicates the write data provided by the BISTR processor.

An address generator logic block 308 of the TRL wrapper is operable responsive to the address signal information (TA[n:0]) and control signal information (CW[3:0]) for generating test addresses for both read and write operations with respect to the memory instance 322. Reference numeral 316 refers to two exemplary test address signals (TadrA and TadrB) provided by the address generator logic block 308. A command generator logic block 310 of the TRL wrapper also operates responsive to CW[3:0] signals in conjunction with CA[1:0] signals for generating the test commands for both read and write operations. As illustrated, reference numeral 318 exemplifies the following command signals generated by the command generator 310: TWEA or Test Write Enable (write control signal); TMEA or Test Memory Enable for a write port; and TMEB or Test Memory Enable for a read port. A data generator logic block 312 associated with the TRL wrapper operates responsive to D[1:0] and CD signals and generates appropriate data for write and compare operations. Reference numeral 320 refers to a multi-bit test write data (e.g., 2-bit test data or TD[1:0]) generated by the data generator logic block 312. A data comparison and error capture block 314 operates responsive to the data output provided by the memory instance 322, command signals from the command generator logic block 310 and compare data provided by the data generator logic block 312 for detecting errors and capturing the same depending upon a memory read clock cycle. Output from the data comparison and capture block 314 is provided to a current error block 326 as well as a reconfiguration and repair block 324 that is operable responsive to redundancy signal information (Redundancy Scan In or RSCIN and Redundancy Scan Enable or RSCEN). Where and when necessary, the reconfiguration and repair block 324 may provide appropriate reconfiguration control signaling (Reconfiguration Enable or RECEN) with respect to the memory instance 322.

Figure 4:
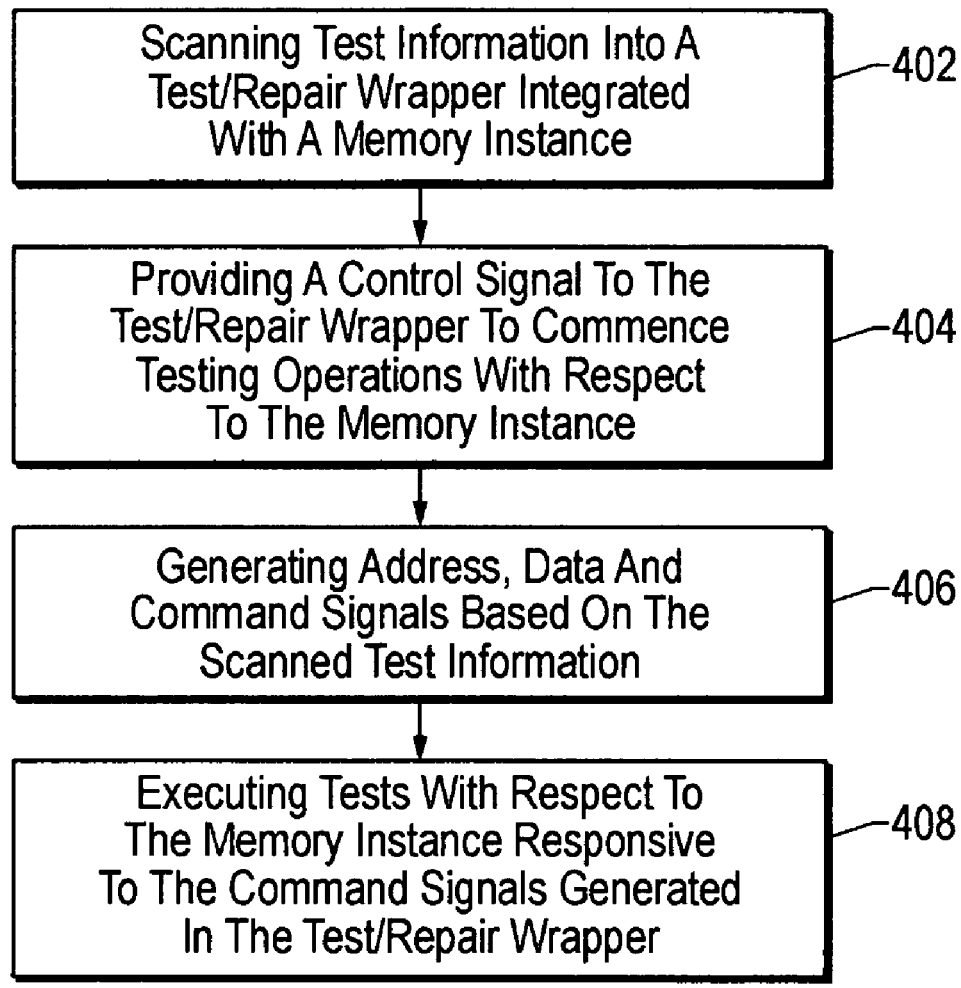
FIG. 4 is a flow chart of a method of testing memory at speed according to one embodiment of the present invention.

Referring now to FIG. 4, depicted therein is a flow chart of a method of testing memory at speed according to one embodiment of the present invention. Test information, operable to perform one or more tests in a "serial batch" mode, is first scanned into a test/repair wrapper block integrated with a memory instance (block 402). As alluded to hereinabove, the scanning operation may be clocked using a test clock, which is generally slower than a read/write clock associated with the memory instance. Thereafter, a strobe control signal is provided to the wrapper to commence testing operations with respect to the memory instance (block 404). Responsive to the strobe control signaling, logic circuitry associated with the test/repair wrapper generates test address, data and command/control signals based on the scanned test information (block 406). One or more tests are then executed with respect to the memory instance responsive to the command/control signals generated in the test/repair wrapper, using the locally generated test address and data signals and the read/write clock associated with the memory instance (block 408).

Figure 5:
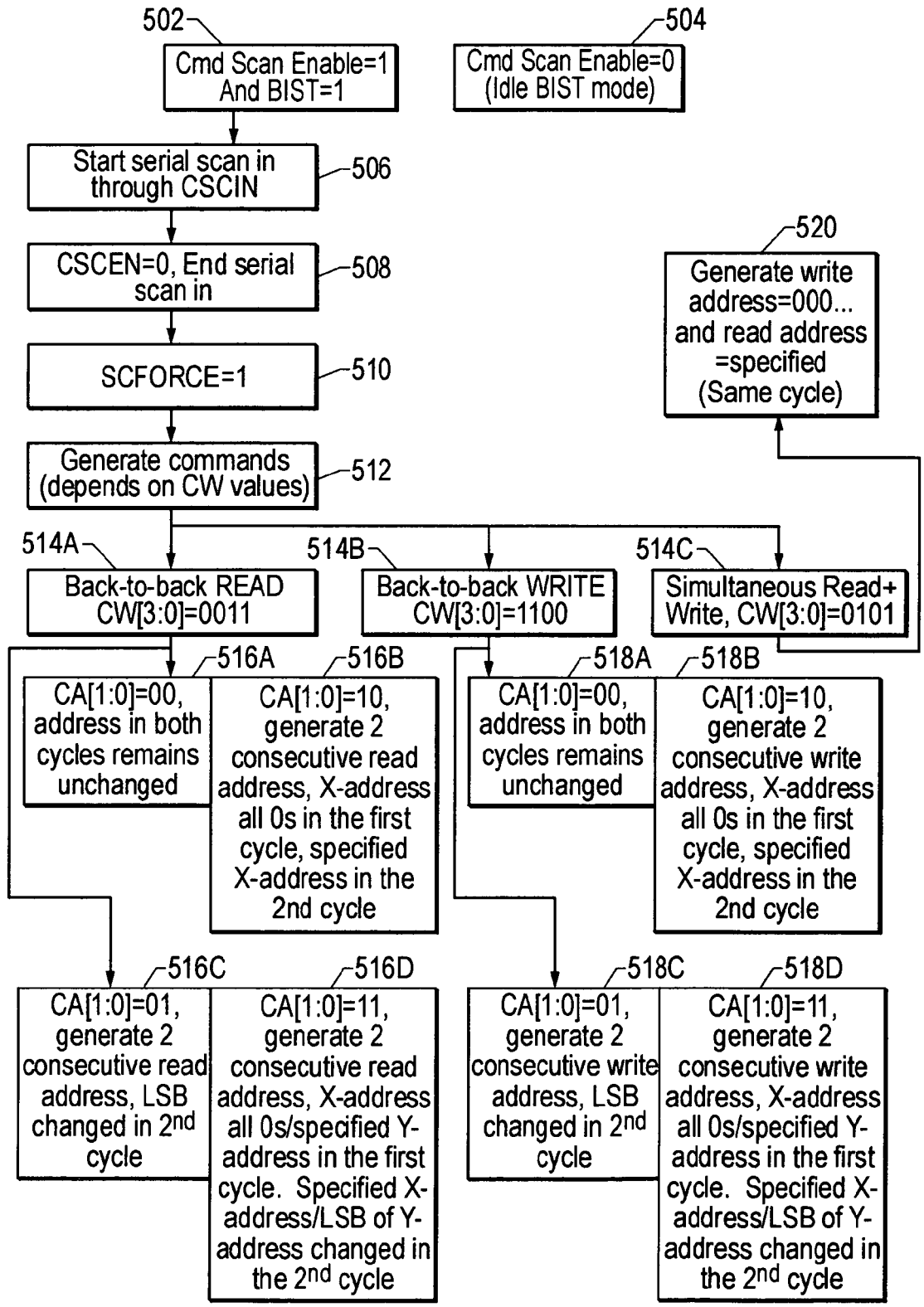
FIG. 5 is a flow chart of a method of testing memory at speed according to another embodiment of the present invention wherein back-to-back read or write operations may be performed.

FIG. 5 is a flow chart of another embodiment of a method of testing memory wherein back-to-back read or write operations are particularly exemplified. As may be appreciated by those skilled in the art, when a back-to-back operation is desired, the test address supplied by a TRL wrapper needs to be modified within one test command cycle. Accordingly, during a back-to-back read or write operation, the memory can perform two consecutive reads or writes in one cycle, thereby testing the memory at memory clock speed. Based on the control signals from the CSC register, the address generator of the TRL wrapper is operable to generate an address for a back-to-back cycle, wherein the address switching depends on the control inputs CA0 and CA1. In one implementation, CA0 controls the switching of the least significant bit (LSB) of the address while CA1 controls the address to switch from the lowest address to a specified address stored in the CSC register block. Clearly, other address switching logic implementations may also be provided in further embodiments of the present invention. Moreover, the address generator of the TRL wrapper can also generate different read and write addresses during a simultaneous read and write operation (which in one case can be different addresses on the same memory column), thereby testing bitline coupling on a single memory column.

As explained hereinabove, the scanning of test information into a TRL wrapper is controlled by the CSCEN signal logic. When CSCEN=1, BIST clock=1 (that is, the BISTR processor is in scanning mode as shown in block 502), serial scan-in is effectuated through the CSCIN signal (block 506). When CSCEN=0, however, Idle BIST mode is maintained (block 504). Upon completion of loading of the test information as applicable, the serial scan-in operation is terminated by driving CSCEN to a logic LOW (block 508). The test strobe signal SCFORCE is then driven to a logic HIGH in order to commence one or more testing operations by the TRL wrapper (block 510), whereupon appropriate commands may be generated based on the logic levels of the CW[3:0] signals (block 512). The following Table sets forth a list of test operations that may be implemented according to one embodiment of the present invention:

TABLE I

| CW[] | Operation |
| --- | --- |
| [0000] | Idle, no operation |
| [0100] | Single cycle write operation |
| [0001] | Single cycle read operation |
| [0101] | Simultaneous read/write operation, same cycle |
| [1100] | Back-to-back write (BBW) operation |
| [0110] | BBW followed by read operation |
| [0011] | Back-to-back read (BBR) operation |
| [1001] | BBR followed by write operation |

Continuing to refer to FIG. 5, blocks 514A, 514B, and 514C exemplify three of the test operations enumerated above. At block 514A, a back-to-back read operation is illustrated, where the CW[3:0] signals are set to [0011]. Address switching control with respect to this operation is determined by the logic levels of the CA[1:0] signals. As shown at block 516A, the test address in both cycles remains unchanged when CA[1:0]=[00]. When CA[1:0]=[10], two consecutive test addresses are generated for the BBR operation: all 0's (i.e., the lowest memory address) in the first cycle, followed by a specified memory address in the second cycle (block 516B). When CA[1:0]=[01], again two consecutive test addresses are generated; however, the LSB of the address used in the first cycle will be changed in the second cycle (block 516C). When CA[1:0]=[11], two addresses with different rows and columns will be generated for the BBR operation (block 516D). For the first cycle, the row address (i.e., X-address) will be all 0's and the column address (i.e., Y-address) will be a specified address. The second address for the following cycle will be such that a specified X-address is used in conjunction with a modification of the Y-address used in the first cycle (e.g., the LSB of the Y-address is changed).

A back-to-back write operation is exemplified at block 514B, where the CW[3:0] signals are set to [1100]. Again, address switching control with respect to this operation is determined by the logic levels of the CA[ ] signals in a manner similar to the process described above with respect to a BBR operation. As shown at block 518A, the test address in both cycles remains unchanged when CA[1:0]=[00]. When CA[1:0]=[10], two consecutive test addresses are generated for the BBR operation: all 0's (i.e., the lowest memory address) in the first cycle, followed by a specified memory address in the second cycle (block 518B). When CA[1:0]=[01], again two consecutive test addresses are generated; however, the LSB of the address used in the first cycle will be changed in the second cycle (block 518C). When CA[1:0]=[11], two addresses with different rows and columns will be generated for the write operation (block 518D), much like the addresses generated for the BBR operation. Further, as alluded to hereinabove, both BBR and BBW operations provide for memory testing at speed.

At block 514C, a simultaneous read and write operation is exemplified, where the CW[3:0] signals are set to [0101]. In the same test cycle, a test address for a write operation and a test address for a read operation are provided (block 520). By specifying the same Y-address for both operations, bitline coupling may be tested for a particular memory instance.

Figure 6:
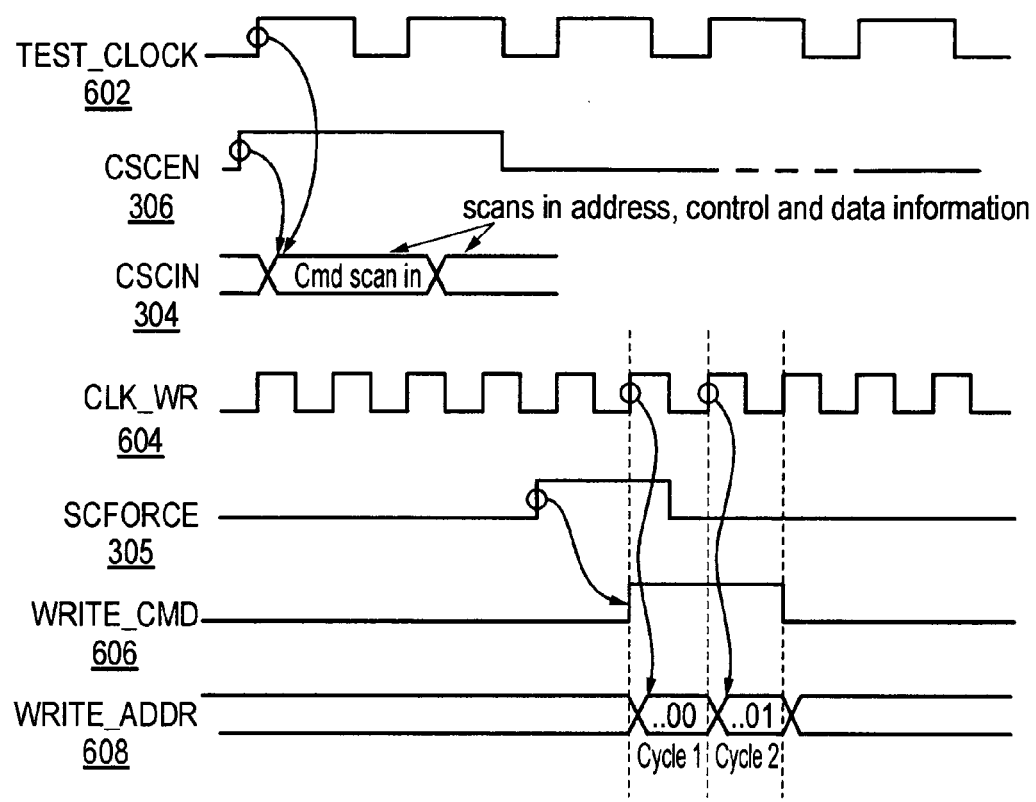
FIG. 6 is a timing diagram associated with an exemplary back-to-back write operation in accordance with an embodiment of the present invention.

FIG. 6 is a timing diagram associated with an exemplary back-to-back write operation in accordance with an embodiment of the present invention. As illustrated, a Test_Clock 602 associated with the BISTR processor is used in conjunction with CSCEN 306 for clocking the scanning of test information, i.e., address information, control information and data information, into a TRL wrapper's CSC register block. Responsive to a rising edge in Test_Clock 602 and CSCEN 306, the scanning operation commences, as indicated by the logic levels on CSCIN 304. Responsive to a rising edge in SCFORCE 305 that operates as a test strobe signal, a back-to-back write command, WRITE_CMD, 606 is generated that is clocked on a rising edge of the memory read/write clock, CLK_WR 604, and lasts for two memory clock cycles. The write address (WRITE_ADDR) 608 switches to a first address in the first clock cycle as specified during the scan-in phase (based on the control signal input) and then changes to a second address for the next write clock cycle.

Based on the foregoing, it should be appreciated that the present invention provides a simple yet efficient and elegant memory testing scheme whereby the test and repair logic is integrated into the memory such that the various deficiencies and shortcomings of the current testing solutions are advantageously overcome. The memory instances (e.g., compilable memory instances) can be tested at speed and the total test cycle time is reduced by half due to the back-to-back address/data/control switching mechanism of the present invention. Better timing control is also realized because the test signals are locally generated by the TRL wrapper circuitry instead of a distant BISTR processor.

It is believed that the operation and construction of the present invention will be apparent from the foregoing Detailed Description. While some aspects of the method and circuitry shown and described may have been characterized as being preferred, it should be readily understood that various changes and modifications could be made therein without departing from the scope of the present invention as set forth in the following claims.

What is claimed is:

1. A memory compiler implemented on a computer readable medium for compiling at least one self-Test and repair (STAR) memory instance, comprising:
    a code portion for generating a built-in self-test and repair (BISTR) processor associated with said at least one STAR memory instance; and
    a code portion for generating a test and repair wrapper operable to be integrated with said at least one STAR memory instance, wherein said test and repair wrapper functions, responsive to test information scanned in by said BISTR processor, to generate address, data and command signals for effectuating at least one test with respect to said STAR memory instance.

2. The memory compiler implemented on a computer readable medium for compiling at least one STAR memory instance as set forth in claim 1, wherein said at least one test is operable to be executed at speed using a memory clock operable with said STAR memory instance.

3. The memory compiler implemented on a computer readable medium for compiling at least one STAR memory instance as set forth in claim 1, wherein said at least one test comprises a write operation.

4. The memory compiler implemented on a computer readable medium for compiling at least one STAR memory instance as set forth in claim 1, wherein said at least one test comprises a read operation.

5. The memory compiler implemented on a computer readable medium for compiling at least one STAR memory instance as set forth in claim 1, wherein said at least one test comprises a pair of read and write operations within a test clock cycle that is two memory cycles long.

6. The memory compiler implemented on a computer readable medium for compiling at least one STAR memory instance as set forth in claim 1, wherein said at least one test comprises a back-to-back write operation.

7. The memory compiler implemented on a computer readable medium for compiling at least one STAR memory instance as set forth in claim 6, wherein said back-to-back write operation is operable to be followed by a read operation.

8. The memory compiler implemented on a computer readable medium for compiling at least one STAR memory instance as set forth in claim 1, wherein said at least one test comprises a back-to-back read operation.

9. The memory compiler implemented on a computer readable medium for compiling at least one STAR memory instance as set forth in claim 8, wherein said back-to-back read operation is operable to be followed by a write operation.

10. A method of testing a memory instance, comprising:
scanning test information into a test and repair wrapper integrated with said memory instance, wherein said test and repair wrapper is generated by a memory compiler used for compiling said memory instance;
providing a strobe control signal to said test and repair wrapper for signaling commencement of testing operations with respect to said memory instance;
generating, by said test and repair wrapper, at least one of an address signal, a data signal and a command signal based on said scanned test information; and
executing at least one test with respect to said memory instance responsive to said address, data and command signals generated in said test and repair wrapper.

11. The method of testing a memory instance as set forth in claim 10, wherein said step of scanning test information is effectuated by a built-in self-test and repair (BISTR) processor associated with said memory instance.

12. The method of testing a memory instance as set forth in claim 10, wherein said strobe control signal is provided to said test and repair wrapper by a built-in self-test and repair (BISTR) processor associated with said memory instance.

13. The method of testing a memory instance as set forth in claim 10, wherein said at least one test is executed at speed using a memory clock operable with said memory instance.

14. The method of testing a memory instance as set forth in claim 10, wherein said memory compiler is operable to compile multiple memory instances, each having a different aspect ratio.

15. The method of testing a memory instance as set forth in claim 10, wherein said memory compiler is operable to compile a memory instance selected from at least one of a static random access memory (SRAM) instance, an electrically programmable read-only memory (EPROM) instance, a dynamic random access memory (DRAM) instance, a Flash memory instance, and a register file (RF) memory instance.

16. The method of testing a memory instance as set forth in claim 10, wherein said memory compiler is operable to compile multiple memory instances, each having a test and repair wrapper integrated therewith.

17. A system for testing a memory instance, comprising:
means for scanning test information into a test and repair wrapper integrated with said memory instance, wherein said test and repair wrapper is generated by a memory compiler used for compiling said memory instance;
means for providing a strobe control signal to said test and repair wrapper for signaling commencement of testing operations with respect to said memory instance; and
means associated with said test and repair wrapper for locally generating at least one of an address signal, a data signal and a command signal based on said scanned test information, wherein a test operation is executed with respect to said memory instance responsive to said locally generated address, data and command signals.

18. The system for testing a memory instance as set forth in claim 17, wherein said means for scanning test information comprises a built-in self-test and repair (BISTR) processor.

19. The system for testing a memory instance as set forth in claim 17, wherein said means for providing a strobe control signal comprises a built-in self-test and repair (BISTR) processor.

20. The system for testing a memory instance as set forth in claim 17, wherein said at least one test is executed at speed using a memory clock operable with said memory instance.

21. The system for testing a memory instance as set forth in claim 17, wherein said memory compiler is operable to compile multiple memory instances, each having a different aspect ratio.

22. The system for testing a memory instance as set forth in claim 17, wherein said memory compiler is operable to compile a memory instance selected from at least one of a static random access memory (SRAM) instance, an electrically programmable read-only memory (EPROM) instance, a dynamic random access memory (DRAM) instance, a Flash memory instance, and a register file (RF) memory instance.

23. The system for testing a memory instance as set forth in claim 17, wherein said memory compiler is operable to compile multiple memory instances, each having a test and repair wrapper integrated therewith.

* * * * *